(12) United States Patent
Bhattacharya et al.

(10) Patent No.: US 8,159,262 B1
(45) Date of Patent: Apr. 17, 2012

(54) IMPEDANCE COMPENSATION IN A BUFFER CIRCUIT

(76) Inventors: Dipankar Bhattacharya, Macungie, PA (US); Ashish V. Shukla, Allentown, PA (US); John Christopher Kriz, Palmerton, PA (US); Makeshwar Kothandaraman, Bangalore (IN)

( * ) Notice: Subject to any disclaimer, the term of this patent is extended or adjusted under 35 U.S.C. 154(b) by 0 days.

(21) Appl. No.: 13/030,278

(22) Filed: Feb. 18, 2011

(51) Int. Cl.
*H03K 17/16* (2006.01)
(52) U.S. Cl. .......................... 326/30; 326/83
(58) Field of Classification Search ............ 326/26, 326/27, 30, 82, 83, 87
See application file for complete search history.

(56) References Cited

U.S. PATENT DOCUMENTS

| | | | | |
|---|---|---|---|---|
| 5,254,883 | A * | 10/1993 | Horowitz et al. | 326/30 |
| 6,064,230 | A * | 5/2000 | Singh | 326/83 |
| 6,567,318 | B2 * | 5/2003 | Bedarida et al. | 365/189.05 |
| 6,985,008 | B2 | 1/2006 | Lundberg | |
| 7,642,807 | B2 | 1/2010 | Bhattacharya et al. | |
| 8,063,623 | B2 * | 11/2011 | Negoi et al. | 323/312 |
| 2002/0109525 | A1 * | 8/2002 | Shin | 326/26 |
| 2006/0017457 | A1 * | 1/2006 | Pan et al. | 326/32 |
| 2009/0091358 | A1 * | 4/2009 | Chauhan et al. | 327/108 |
| 2012/0007632 | A1 * | 1/2012 | Kang | 326/30 |

* cited by examiner

*Primary Examiner* — Don Le
(74) *Attorney, Agent, or Firm* — Otterstedt, Ellenbogen & Kammer, LLP

(57) ABSTRACT

A compensation circuit for controlling a variation in output impedance of at least one buffer circuit includes a monitor circuit having a pull-up portion comprising at least one PMOS transistor and a pull-down portion comprising at least one NMOS transistor. The monitor circuit is configured to track an operation of an output stage in the buffer circuit and is operative to generate a first control signal indicating a status of at least one characteristic of corresponding pull-up and pull-down portions in the output stage over variations in PVT conditions to which the buffer circuit may be subjected. The compensation circuit further includes a control circuit generating first and second sets of digital control bits for compensating the pull-up and pull-down portions in the output stage over prescribed variations in PVT conditions. The second set of digital control bits is generated based at least on the first set of digital control bits and the first control signal.

25 Claims, 10 Drawing Sheets

FIG. 1A
100
FIG. 1B
150
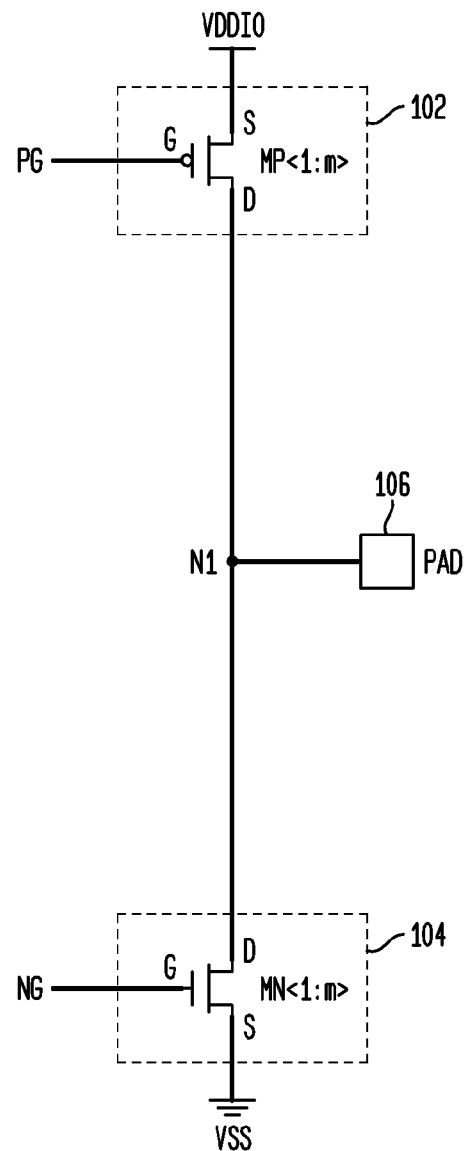
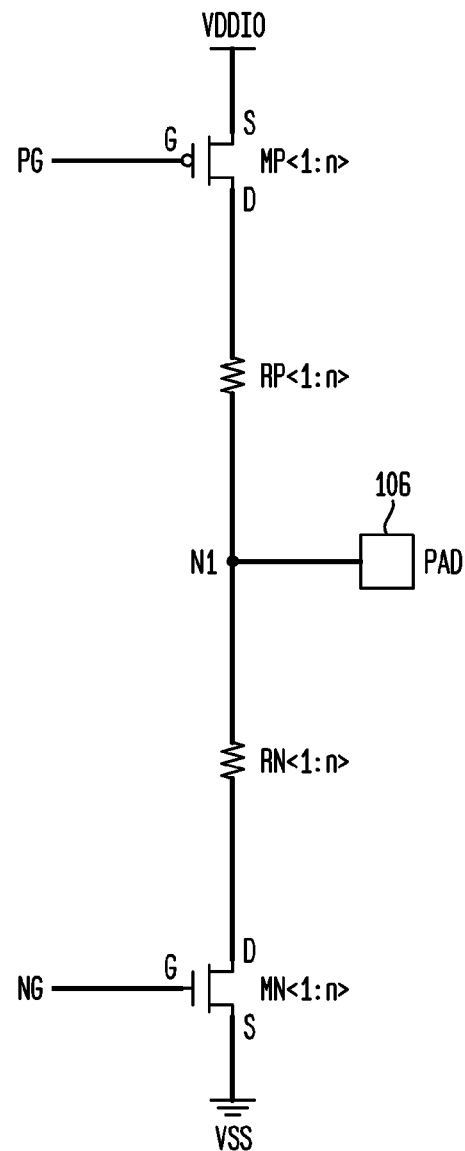

170

300

400

500

700

800

900

950

IMPEDANCE COMPENSATION IN A BUFFER CIRCUIT

FIELD OF THE INVENTION

The present invention relates generally to electronic circuits, and more particularly relates to compensation techniques for use in a buffer circuit.

BACKGROUND OF THE INVENTION

In modern electronic circuits, such as, for example, input/output (IO) buffers, it is desirable to control the variation in output impedance of the IO buffers for a variety of reasons, including, but not limited to, transmission line matching, minimizing switching noise (e.g., di/dt), optimizing signal swing, etc. In many high-speed, high-bandwidth applications, such as, for example, memory interfacing (e.g., double data rate 3 (DDR3) or DDR4 memory), it is important to control the output impedance of the buffer within a specified tolerance limit over a prescribed range of operating conditions so as to reduce signal degradation. It is also important to control pull-up and pull-down impedances of the buffer in such a way that the relative difference between the impedances is minimized.

In order to achieve such tight control of output impedance, a buffer, often referred to as a compensated buffer, is typically employed which is adapted to compensate for variations in integrated circuit (IC) process, supply voltage and/or temperature (PVT) conditions to which the buffer may be subjected. In one implementation, a PVT compensated buffer utilizes a compensation circuit including a PVT control block which monitors a deviation in output impedance of a block of one or more reference devices matched to corresponding devices (e.g., pre-drivers) in an output stage of the buffer to be compensated. The PVT control block generates a set of digital bits, often referred to as "PVT bits" (PVTBITS), that are used to control the reference devices (e.g., turning the devices on or off) so as to maintain a constant output impedance. The output impedance of the reference block will be a function of the number of devices in the block that are turned on or off at any given time. These PVT bits are also fed to the buffer to control the output impedance of the buffer output stage devices in a similar manner. The number of pre-drivers in the buffer output stage is directly proportional to the number of digital control bits.

In the context of metal-oxide-semiconductor (MOS) transistor devices, since p-channel MOS (PMOS) transistor devices and n-channel MOS (NMOS) transistor devices do not generally track one another, pull-up devices (which typically employ PMOS transistors) are traditionally compensated separately from pull-down devices (which typically employ NMOS transistors), thereby resulting in significantly increased complexity of the design, reduced IC layout area efficiency, and higher relative error between pull-up and pull-down impedances. Accordingly, such conventional approaches to buffer compensation are impractical and/or undesirable.

SUMMARY OF THE INVENTION

The present invention, in illustrative embodiments thereof, relates to compensation techniques for controlling a variation in output impedance of a buffer circuit over variations in PVT conditions to which the buffer circuit may be subjected. The inventive buffer compensation techniques are performed in such a way that design complexity and layout area penalty is significantly reduced compared to conventional compensation approaches. To accomplish this, illustrative embodiments of the invention compensate the buffer circuit using a single compensation type (e.g., either pull-up or pull-down compensation), and then determine the other compensation type as a function of the status of a monitoring circuit which may be included in the buffer circuit.

In accordance with an embodiment of the invention, a compensation circuit for controlling a variation in output impedance of at least one buffer circuit includes a monitor circuit including a pull-up portion comprising at least one PMOS transistor and a pull-down portion comprising at least one NMOS transistor. The monitor circuit is configured to track an operation of an output stage in the buffer circuit and is operative to generate at least a first control signal indicative of a status of at least one characteristic of corresponding pull-up and pull-down portions in the output stage over variations in PVT conditions to which the buffer circuit may be subjected. The compensation circuit further includes a control circuit generating a first set of digital control bits and a second set of digital control bits for compensating the pull-up and pull-down portions in the output stage of the buffer circuit over prescribed variations in PVT conditions. The second set of digital control bits is generated based at least on the first set of digital control bits and the first control signal.

In accordance with another embodiment of the invention, a compensated buffer circuit includes at least one buffer including an output stage operative to receive an input signal and to generate an output signal at an output of the buffer circuit, the output stage including a pull-up portion comprising at least one PMOS transistor and a pull-down portion comprising at least one NMOS transistor. The compensated buffer circuit further includes at least one compensation circuit coupled with the buffer for controlling a variation in output impedance of the buffer. The compensation circuit comprises a monitor circuit including a pull-up portion comprising at least one PMOS transistor and a pull-down portion comprising at least one NMOS transistor. The monitor circuit is configured to track an operation of the output stage in the buffer and is operative to generate a first control signal indicative of a status of at least one characteristic of the pull-up and pull-down portions in the output stage over variations in process, voltage and/or temperature conditions to which the buffer may be subjected. The compensation circuit further comprises a control circuit generating a first set of digital control bits and a second set of digital control bits for compensating the pull-up and pull-down portions in the output stage of the buffer over prescribed variations in PVT conditions. The second set of digital control bits is generated based at least on the first set of digital control bits and the first control signal.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals indicate corresponding elements throughout the several views, and wherein:

FIG. 1A is a schematic diagram depicting at least a portion of an exemplary output driver stage suitable for use in a buffer circuit application;

FIG. 1B is a schematic diagram depicting at least a portion of an illustrative linearized output driver stage suitable for use in a buffer circuit application;

Figure 1C:
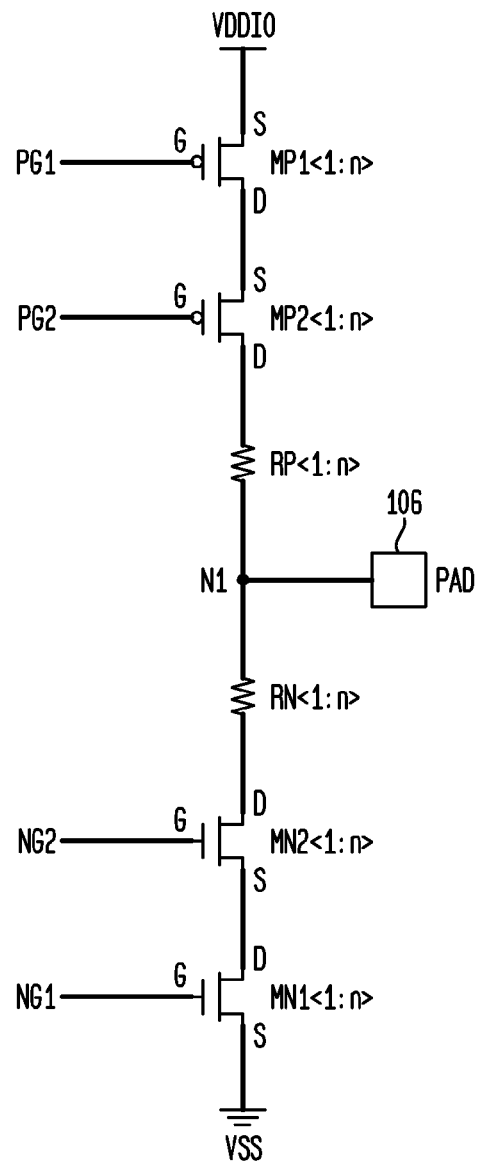
FIG. 1C is a schematic diagram depicting at least a portion of an illustrative high-voltage output driver stage suitable for use in a buffer circuit application.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF THE INVENTION

The present invention, according to aspects thereof, will be described herein in the context of illustrative buffer circuits adapted to compensate for variations in PVT conditions to which the buffer circuit may be subjected. It should be understood, however, that the present invention is not limited to these or any other particular circuit arrangements. Rather, the invention is more generally applicable to techniques for compensating a buffer circuit in such a way that design complexity and layout area penalty is significantly reduced compared to conventional buffer design approaches, among other advantages. To accomplish this, embodiments of the invention compensate the buffer circuit using a single type of compensation (e.g., either pull-up or pull-down compensation) and then determine the other remaining compensation type based on the status of a monitoring circuit. In this manner, techniques of the invention provide an improved buffer circuit having reduced design complexity and layout area. Moreover, it will become apparent to those skilled in the art given the teachings herein that numerous modifications can be made to the embodiments shown that are within the scope of the present invention. That is, no limitations with respect to the specific embodiments described herein are intended or should be inferred.

Although implementations of the present invention described herein may be implemented using PMOS and NMOS transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

FIG. 1A is a schematic diagram depicting at least a portion of an exemplary output driver stage 100 suitable for use in a buffer circuit application. Output driver stage 100 preferably comprises a pull-up circuit 102 connected between and a first voltage supply, which may be a higher input/output (I/O) voltage supply, VDDIO (e.g., about 1.8 volts), and an output node N1, and a pull-down circuit 104 connected between node N1 and a second voltage supply, which may be a voltage return, VSS, of the output stage (e.g., about zero volts or ground). It is to be understood that the invention is not limited to any specific voltage supply levels. Output node N1 is preferably connected with an I/O pad (PAD) 106 which is operative to provide an external connection with the output stage 100.

Pull-up circuit 102 preferably includes a plurality, m, of PMOS transistor devices MP (i.e., MP<1:m>) which may be formed as parallel fingers in a conventional manner, where m is an integer. Likewise, pull-down circuit 104 preferably includes a plurality, m, of NMOS transistor devices MN (i.e., MN<1:m>) which may be formed as parallel fingers in a conventional manner. PMOS transistors MP<1:m> are driven by a first control signal, PG, and NMOS transistors MN<1:m> are driven by a second control signal, NG. More particularly, a source (S) of each of PMOS transistors MP<1:m> is adapted for connection with the first voltage supply VDDIO, a drain (D) of MP<1:m> is connected with a drain of each of NMOS transistors MN<1:m> at node N1, a gate (G) of MP<1:m> is adapted for receiving the first control signal PG, a source of MN<1:m> is adapted for connection with the second voltage supply VSS, and a gate of MN<1:m> is adapted for receiving the second control signal NG. It is to be noted that pull-up and pull-down circuit sections need not have the same number of legs (m) and each leg or a parallel combination of legs may be driven by respective gate voltages PGi or NGi, where i is an integer.

It is to be appreciated that, because an MOS device is symmetrical in nature, and thus bi-directional, the assignment of source and drain designations in the MOS device is essentially arbitrary. Therefore, the source and drain of a given MOS device may be referred to herein generally as first and second source/drain, respectively, where "source/drain" in this context denotes a source or a drain.

Control signals PG and NG may be generated, for example, by a pre-driver circuit coupled with output stage 100. Pre-driver logic is preferably designed in such a manner that when signal PG transitions to a logic high level (e.g., about VDDIO or 1.8 volts), signal NG also transitions to a logic high level (preferably having substantially the same edge/transition rate), thereby pulling node N1 to a logic low level (e.g., about VSS or zero volts). Similarly, when signal NG transitions to a logic low level, signal PG also transitions to a logic low level, thereby pulling node N1 to a logic high level. Because of the non-linear nature of an output stage formed solely of active devices, the impedance of the buffer circuit employing output stage 100 is typically measured at about 400 millivolts (mV) away from the voltage supply rails. Thus, for example, when pad 106 is driven high, pull-up impedance is measured at VDDIO−400 mV (e.g., about 1.4 volts for VDDIO=1.8 volts). Similarly, when pad 106 is driven low, pull-down impedance is measured at VSS+400 mV (e.g., about 400 mV for VSS=0).

Output stage 100 shown in FIG. 1A can be modified as depicted in FIG. 1B to achieve enhanced linearity. Specifically, with reference to FIG. 1B, an exemplary output stage 150 is shown which is comparable to the output stage 100 of FIG. 1A, except that each finger of PMOS transistors MPi, i=1 . . . n, where i and n are integers (i.e., MP<1:n>), is connected in series with a corresponding resistor, RPi, i=1 . . . n (i.e., RP<1:n>). Similarly, each finger of NMOS transistors MNi, i=1 . . . n (i.e., MN<1:n>), is connected in series with a corresponding resistor, RNi, i=1 . . . n (i.e., RN<1:n>). More particularly, for each finger of PMOS transistors MP<1:n>, a source of a given transistor MPi is adapted for connection with VDDIO, a gate of MPi is adapted for receiving control signal PG, a drain of MPi is connected with a first terminal of corresponding resistor RPi, and a second terminal of RPi is connected with pad 106. Likewise, for each finger of NMOS transistors MN<1:n>, a source of a given transistor MNi is adapted for connection with VSS, a gate of MNi is adapted for receiving control signal NG, a drain of MNi is connected with a first terminal of corresponding resistor RNi, and a second terminal of RNi is connected with pad 106.

Polysilicon (i.e., poly) resistors are preferably employed for each of resistors RPi and RNi, although alternative materials (e.g., n+ or p+ diffusion, n-tub resistors, etc.) may be selected for the resistors depending upon the particular application in which output stage 150 is to be used. The respective resistance values of resistors RPi and RNi are preferably selected so as to be substantially greater than a drain-to-source impedance of the active devices (namely, transistors MPi and MNi), such that the impedance contribution of the active devices is a relatively small percentage (e.g., about twenty-five percent nominally) of the total output impedance of the output stage 150. A linear portion of the total impedance (e.g., attributable primarily to resistors RPi and RNi) is preferably made higher than an active portion of the total impedance (e.g., attributable to transistors MPi and MNi) but ultimately the size of resistors RPi and RNi will be a trade-off between results versus size and performance. A smaller active impedance means higher transistor size, higher di/dt (i.e., change in current (di) with respect to change in time (dt)), higher pre-driver size, etc. For an output stage configured in the manner shown in FIG. 1B, impedance is typically measured with the output (node N1) at half the voltage supply $$\left(e.g., \frac{VDDIO - VSS}{2}\right),$$

rather than at 400 mV away from the voltage supply rails as in FIG. 1A.

FIG. 1C is a schematic diagram depicting at least a portion of an illustrative high-voltage output driver stage 170 suitable for use in a buffer circuit application. Output driver stage 170 may be used, for example, in applications in which the voltage supply VDDIO is higher than a prescribed maximum drain-to-source voltage which the PMOS and/or NMOS transistor devices can otherwise sustain without damage (e.g., VDDIO equal to about 3.6 volts or higher, although the invention is not limited to any specific voltage level for VDDIO). In this instance, a plurality of PMOS transistor devices and/or a plurality of NMOS transistor devices are connected together in series between the voltage supplies VDDIO and VSS. It is to be appreciated that the invention is not limited to the number of series-connected transistors employed in the output driver stage 170.

More particularly, output driver stage 170 may comprise a first PMOS transistor device, which alternatively may include a plurality of parallel-connected transistor devices, MP1<1:n> and a second PMOS transistor device, which may also include a plurality of parallel-connected transistor devices, MP2<1:n>. A source of MP1<1:n> is adapted for connection with VDDIO, a drain of MP1<1:n> is connected with a source of MP2<1:n>, a drain of MP2<1:n> is connected with a first terminal of a first resistor, RP<1:n>, a second terminal of RP<1:n> is connected with an external I/O pad (PAD) 106 at node N1, a gate of MP1<1:n> is adapted for receiving a first bias signal, PG1, and a gate of MP2<1:n> is adapted for receiving a second bias signal, PG2. Similarly, output driver stage 170 may comprise a first NMOS transistor device, which alternatively may include a plurality of parallel-connected transistor devices, MN1<1:n> and a second NMOS transistor device, which may also include a plurality of parallel-connected transistor devices, MN2<1:n>. A source of MN1<1:n> is adapted for connection with VSS, a drain of MN1<1:n> is connected with a source of MN2<1:n>, a drain of MN2<1:n> is connected with a first terminal of a first resistor, RN<1:n>, a second terminal of RN<1:n> is connected with pad 106 at node N1, a gate of MN1<1:n> is adapted for receiving a third bias signal, NG1, and a gate of MN2<1:n> is adapted for receiving a fourth bias signal, NG2. In this manner, the voltage across any one of transistors MP1<1:n>, MP2<1:n>, MN1<1:n>, and MN2<1:n> in the output driver stage 170 will be less than or equal to a maximum prescribed voltage level of the respective devices.

Figure 2:
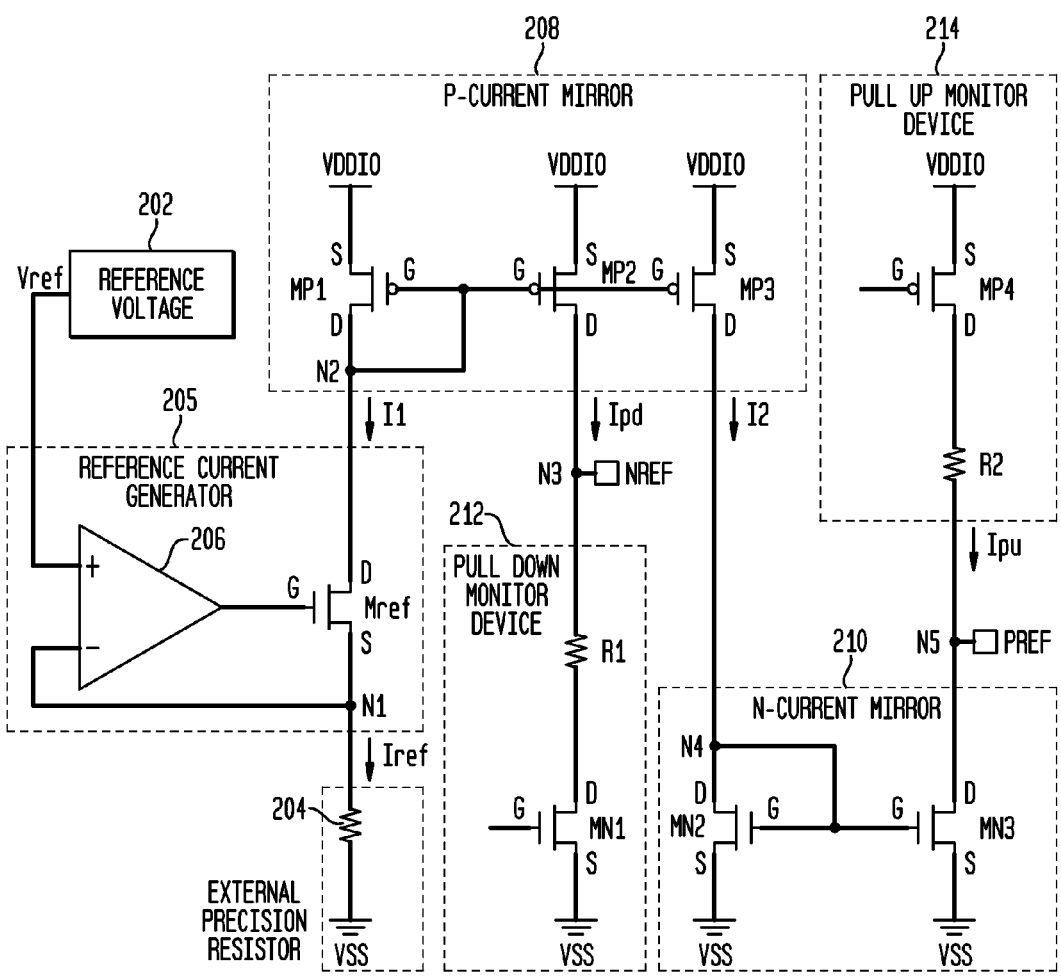
FIG. 2 is a schematic diagram depicting at least a portion of an exemplary PVT compensation circuit which utilizes separate and independent pull-up and pull-down impedance compensation and that may be modified to implement techniques of the present invention.
Figure 2:
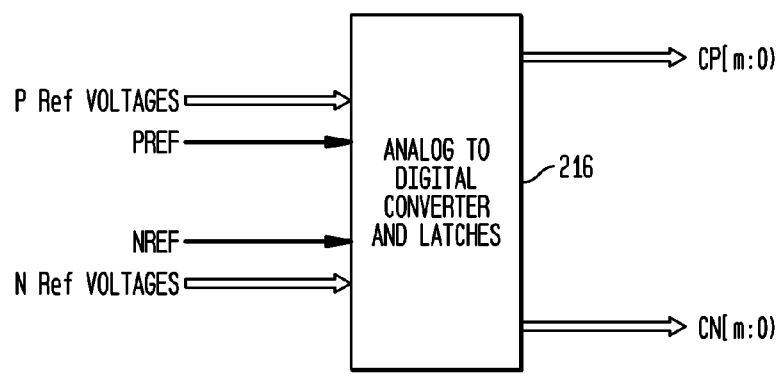

FIG. 2 is a schematic diagram depicting at least a portion of an exemplary PVT compensation circuit 200 which utilizes separate and independent pull-up and pull-down impedance compensation. PVT compensation circuit 200 may be employed, for example, in a compensated buffer circuit for compensating one of more PMOS and NMOS transistor devices in at least an output stage of the buffer circuit. Referring now to FIG. 2, a reference voltage, Vref, generated by a reference voltage source 202, is preferably converted into a reference current, Iref, through a precision resistor. More particularly, resistor 204 is preferably a precision external resistor, although an internal resistor may alternatively be used where a lower accuracy can be tolerated. Resistor 204 is used to generate a substantially constant current, Iref, within the PVT compensation circuit 200 which is either forced into one or more monitor devices (e.g., pull-down monitor device 212 or pull-up monitor device 214) in the PVT compensation circuit, or is compared against a current generated in the one or more monitor devices. The monitor devices are preferably substantially matched to one or more corresponding devices forming an output stage of a compensated buffer circuit, as will be described in further detail below. In this manner, PVT compensation circuit 200 will more accurately compensate for variations in PVT conditions to which the buffer circuit may be subjected. Reference voltage source 202 which is operative to generate the reference voltage Vref may comprise, for example, a band gap reference circuit. Alternatively, reference voltage source 202 may comprise a resistor divider, such that the reference voltage Vref may be generated using some fraction of a voltage supply (e.g., VDDIO), in accordance with conventional voltage division techniques. The invention contemplates other methods for generating a reference voltage, as will be known by those skilled in the art. Similarly, the reference voltage Vref may be generated externally and supplied to the PVT compensation circuit 200. The reference voltage Vref is applied across resistor 204 using a reference current generator circuit 205, which functions essentially as a voltage-to-current converter.

Reference current generator circuit 205 preferably comprises an operational amplifier (op-amp) 206 and an NMOS transistor device, Mref, coupled with the op-amp in a feedback configuration. Specifically, a first input of op-amp 206, which may be a non-inverting (+) input, is adapted to receive the reference voltage Vref, an output of the op-amp is connected to a gate of transistor Mref, a source of Mref is connected to a second input of the op-amp, which may be an inverting (−) input, at a first node N1. A first terminal of precision resistor 204 is connected with the reference current generator at node N1 and a second terminal of resistor 204 is adapted for connection with a voltage return of the compensation circuit 200, which may be VSS or ground. In this manner, because of the feedback configuration of the op-amp 206, node N1 will be substantially equal to the reference voltage Vref A drain of transistor Mref forms an output of the reference current generator 205 and is operative to generate a current, I1, which is ideally equal to Iref and is a function of reference voltage Vref and a resistance of resistor 204. Since Vref and the resistance value of resistor 204 are both known, the reference current Iref, and thus current I1, will also be known.

The reference current Iref is preferably replicated, using, for example, a first current mirror (P-current mirror) 208 and a second current mirror (N-current mirror) 210, to provide a pull-down current, Ipd, to one or multiple pull-down structures (e.g., transistors MNi shown in FIGS. 1A and 1B), and to provide a pull-up current, Ipu, to one or multiple pull-up structures (e.g., transistors MPi in FIGS. 1A and 1B), respectively. More particularly, first current mirror 208 preferably includes first, second and third PMOS transistor devices MP1, MP2 and MP3, respectively. Transistor MP1 is connected in a diode configuration, having a source adapted for connection with VDDIO, and a gate and drain connected to a drain of transistor Mref in reference current generator 205 at node N2. Gates of transistors MP2 and MP3 are connected with the gate of transistor MP1 at node N2, sources of MP2 and MP3 are adapted for connection with VDDIO, a drain of MP2 is connected with a pull-down monitor circuit 212 at node N3, and a drain of MP3 is connected with the second current mirror 210 at node N4. Since the gates of transistors MP1, MP2 and MP3 are connected together and the sources of MP1, MP2 and MP3 are connected together, the gate-to-source voltage across each transistor MP1, MP2 and MP3 will be the same. Consequently, assuming the drain voltages of transistors MP1, MP2 and MP3 are substantially the same relative to one another, currents I1, Ipd and I2 generated by MP1, MP2 and MP3, respectively, will be substantially equal. Alternative methods for replicating the reference current Iref are similarly contemplated.

Current I2 is preferably replicated by the second current mirror 210 to generate pull-up current Ipu. Current mirror 210 comprises first and second NMOS transistor devices MN2 and MN3, respectively. Sources of transistors MN2 and MN3 are adapted for connection with VSS, a drain and gate of MN2 are connected to a drain of transistor MP3 in first current mirror 208 at node N4 and adapted to receive current I2, a gate of MN3 is connected with the gate and drain of MN2, and a drain of MN3 is connected with a pull-up monitor circuit 214 at node N5. Since the gates of transistors MN2 and MN3 are connected together and the sources of MN2 and MN3 are connected together, the gate-to-source voltage across each transistor MN2 and MN3 will be the same. Consequently, assuming the drain voltages of transistors MN2 and MN3 are substantially the same relative to one another, currents I2 and Ipu generated by MN2 and MN3, respectively, will be substantially equal.

Pull-down monitor circuit 212 and pull-up monitor circuit 214 are preferably designed to closely approximate and track the operation of pull-down and pull-up portions, respectively, of, for instance, an output stage (e.g., output stage 150 in FIG. 1B) in a buffer circuit. Pull-down monitor circuit 212 thus preferably comprises an NMOS transistor device, MN1, and a resistor, R1, coupled in series with MN1. Transistor MN1 includes a source adapted for connection with VSS, a gate operative to receive a first control signal, which may be VDDIO, and a drain connected with a first terminal of resistor R1. A second terminal of R1 is connected with first current mirror 208 at node N3 and is operative to receive pull-down current Ipd. Pull-up monitor circuit 214 preferably comprises a PMOS transistor device, MP4, and a resistor, R2, coupled in series with MP4. Transistor MP4 includes a source adapted for connection with VDDIO, a gate adapted to receive a second control signal, which may be VSS, and a drain connected with a first terminal of resistor R2. A second terminal of R2 is connected with second current mirror 210 at node N5 and is operative to receive pull-up current Ipu.

Two analog reference signals, NREF and PREF, are generated at nodes N3 and N5, respectively, which collectively reflect a status of the output stage over variations in PVT conditions to which the output stage is subjected. These two analog reference signals NREF and PREF are supplied to an analog-to-digital (A/D) converter circuit 216 where they are converted to corresponding digital control signals, CPj and CNj, where j is a positive integer, also referred to herein as PVT control bits or simply PVT bits. Digital control signals CPj and CNj are a function of PREF and NREF, respectively, as well as P-reference threshold voltages and N-reference threshold voltages (for making comparison decisions) supplied, for example, by a reference voltage source.

Specifically, A/D converter circuit 216 preferably generates a first subset of m+1 digital PVT control (i.e., compensation) bits, CP[m:0], where m is a positive integer, as a function of P-reference voltages and reference signal PREF for compensating one or more PMOS devices in an output stage of the buffer circuit to be compensated. Likewise, A/D converter circuit 216 generates a second subset of m+1 digital PVT control bits, CN[m:0], as a function of N-reference voltages and reference signal NREF for compensating one or more NMOS devices in the output stage of the buffer circuit to be compensated. It is to be understood that the invention is not limited to any particular number of digital control bits generated by A/D converter circuit 216. The number of bits (m+1) in digital control signals CPj and CNj, j=0 . . . m, will depend on the desired granularity (i.e., accuracy) of compensation and area/complexity penalty. Furthermore, A/D converter circuit 216 may include latch circuitry for at least temporarily storing a logical state of digital control signals CP[m:0] and/or CN[m:0].

By using separate compensation for the pull-up and pull-down portions of the buffer circuit output stage, one can achieve fairly tight control of the respective output pull-up and pull-down impedances over all specified PVT conditions. However, the variation between PMOS and NMOS device characteristics (e.g., threshold voltage, impedance, etc.) is not identical with changes in voltage and/or temperature for a given IC fabrication process, and therefore PVT compensation circuit 200 may assign different compensation bits for pull-up and pull-down circuitry, given that the pull-up and pull-down compensation schemes are independent of one another. This will produce different impedances for the respective pull-up and pull-down circuits instantaneously, and the relative impedance ($R_{rel}$), defined as:

$$R_{rel} = \frac{R_{pu} - R_{pd}}{R_{nom}} \times 100\%$$

where $R_{pu}$ is pull-up impedance, $R_{pd}$ is pull-down impedance and $R_{nom}$ is nominal impedance, may be substantially higher than what is required. It is important to constrain $R_{rel}$ to within a prescribed limit, otherwise the difference between pull-up and pull-down impedances may contribute to higher jitter through duty cycle distortion at the output due at least in part to unequal edge rates, reflections, etc.

In order to maintain the difference between pull-up and pull-down impedances to within a prescribed limit, thereby ensuring that a given relative impedance specification is met, one can employ only pull-up compensation or, alternatively, only pull-down compensation and assign the same PVT bits for both pull-up and pull-down devices in the output stage of the buffer circuit to be compensated. However, if compensation is performed based on monitoring of pull-up device characteristics alone, then pull-down impedance will vary by a much larger amount compared to pull-up impedance over a specified range of PVT conditions (mismatch corners) to which the buffer circuit is subjected. Likewise, if compensation is performed based on monitoring of pull-down device characteristics alone, then pull-up impedance will vary by a much larger amount compared to pull-down impedance over the specified range of PVT conditions.

In order to mitigate these problems and thereby improve buffer circuit performance, aspects of the invention advantageously perform impedance compensation using a single compensation type (e.g., either pull-up or pull-down compensation), and then determine the other compensation as a function of the status of a monitoring circuit included in the buffer circuit. Although embodiments of the invention will be described with reference to an exemplary compensation scheme which involves first compensating pull-up devices in at least the output stage of the buffer circuit and then assigning compensation bits for compensating the pull-down devices as a function of pull-up compensation bits, alternative embodiments may first perform pull-down device compensation, with or without modification to the buffer circuit, according to other embodiments of the invention. Modifications to the compensation circuit to implement a pull-up compensation bit assignment based on pull-down device compensation will become readily apparent to those skilled in the art given the teachings herein.

Figure 3:
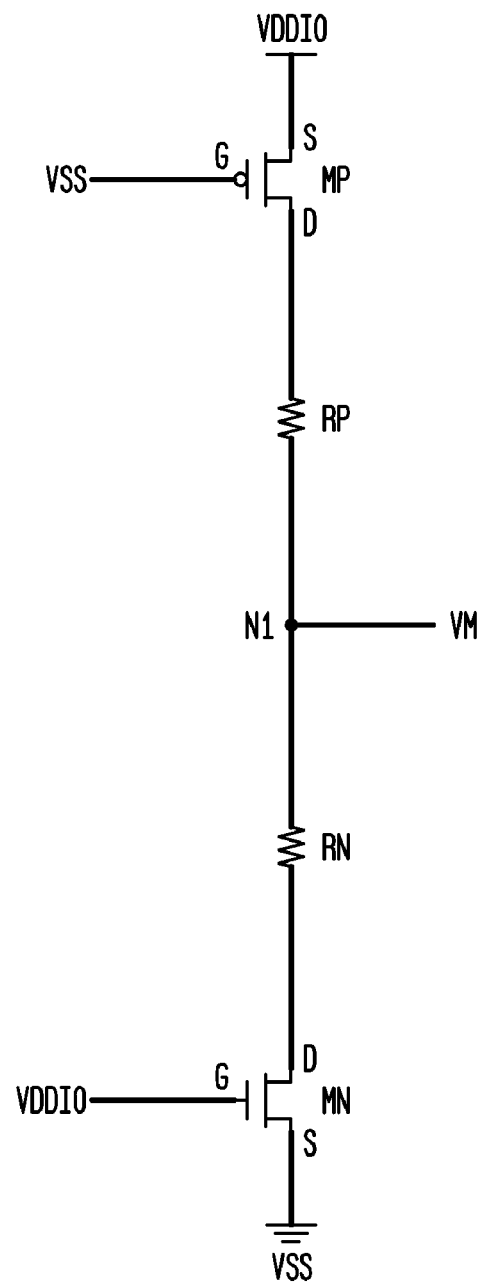
FIG. 3 is a schematic diagram depicting an exemplary PVT monitoring circuit, according to an embodiment of the present invention.

FIG. 3 is a schematic diagram depicting at least a portion of an exemplary PVT monitoring circuit 300, according to an embodiment of the invention. PVT monitoring circuit 300 is preferably designed to closely approximate (i.e., model, track, etc.) an output stage of a buffer circuit to be compensated. Ideally, a pull-up structure in the monitoring circuit 300 is identical to a corresponding pull-up structure in an output stage of a buffer circuit to be compensated, and a pull-down structure in the monitoring circuit is identical to a corresponding pull-down structure in the output stage of the buffer circuit. To accomplish this, PVT monitoring circuit 300 may be fabricated as one or multiple legs of the output stage itself, in accordance with an aspect of the invention. In this manner, PVT monitoring circuit 300 is operative to accurately track one or more operating characteristics of a corresponding buffer circuit output stage over a prescribe range of PVT variations.

More particularly, PVT monitoring circuit 300 preferably includes a pull-up portion comprising a PMOS transistor device, MP, and a first resistor, RP, connected together in series between an output node, N1, and a first voltage supply, which may be VDDIO. Specifically, a source of transistor MP is adapted for connection with VDDIO, a gate of MP is adapted for receiving a first control signal, a drain of MP is connected with a first terminal of resistor RP, and a second terminal of RP is connected with output node N1. Likewise, PVT monitoring circuit 300 includes a pull-down portion comprising an NMOS transistor device, MN, and a second resistor, RN, connected together in series between output node N1 and a second voltage supply, which may be VSS, where VSS is less than VDDIO. Specifically, a source of transistor MN is adapted for connection with VSS, a gate of MN is adapted for receiving a second control signal, a drain of MN is connected with a first terminal of resistor RN, and a second terminal of RN is connected with output node N1. Resistors RP and RN are preferably formed using polysilicon material (e.g., so as to avoid non-linearity associated with certain fabrication materials), although other suitable materials (e.g., P+ or N+ diffusion, N-tub resistors, etc.) are similarly contemplated. Resistors RP and RN function, at least in part, to improve a linearity of the PVT monitoring circuit 300, as previously explained in conjunction with FIG. 1B.

As shown in FIG. 3, the first control signal supplied to the gate of transistor MP is preferably VSS and the second control signal supplied to the gate of transistor MN is VDDIO so that MP and MN are fully turned on. Alternatively, in accordance with another embodiment, transistors MP and MN can be gated by power down signals. In this manner, during a normal mode of operation of the PVT monitoring circuit 300, when the power down signals are de-asserted, transistors MP and MN are fully turned on, and during, for example, a power down mode of operation, when the power down signals are asserted, MP and MN are turned off, thereby beneficially conserving power.

PVT monitoring circuit 300 is operative to generate a reference voltage, VM, at output node N1. The level of voltage VM will be indicative of at least one operating characteristic (e.g., output impedance) of the pull-up and pull-down structures over PVT variations. Under nominal conditions (e.g., nominal PVT), VM is preferably about half VDDIO (i.e., VDDIO/2). As process characteristics, voltage and/or temperature change, VM will be higher or lower than half VDDIO. For example, if the IC fabrication process is such that NMOS transistors (e.g., transistor MN) are fast relative to PMOS transistors (e.g., transistor MP), then pull-down impedance of monitoring circuit 300 will be lower compared to pull-up impedance, and thus voltage VM will be lower than half VDDIO. Likewise, if the process is such that NMOS transistors are slower relative to PMOS transistors, then pull-down impedance of monitoring circuit 300 will be higher compared to pull-up impedance, and thus voltage VM will be higher than half VDDIO. Under all specified PVT conditions, voltage VM is lower than a first prescribed voltage, $V_{minus}$, when NMOS transistors are fast relative to PMOS transistors in the process, and VM is higher than a second prescribed voltage, $V_{plus}$, when NMOS transistors are slow relative to PMOS transistors in the process. $V_{minus}$ and $V_{plus}$ are two threshold voltages that may be defined as follows:

$$V_{minus} = \frac{VDDIO}{2} - V_{\Delta 1} \quad (1)$$

$$V_{plus} = \frac{VDDIO}{2} + V_{\Delta 2} \quad (2)$$

where $V_{\Delta 1}$ and $V_{\Delta 2}$ may be identical to one another.

Even when PMOS and NMOS devices track one another, voltage VM will likely vary over a range of over half VDDIO, depending on PVT. When mismatch corners are considered (e.g., N fast/P slow or N slow/P fast), VM will be somewhat skewed from that previous range. So when pull-down structures (e.g., NMOS devices) are faster, VM will be lower than VDDIO/2 by a certain amount, $V_{\Delta 1}$. Similarly, when pull-down structures are slower, VM will be higher than VDDIO/2 by a certain amount, $V_{\Delta 2}$. These two quantities, $V_{\Delta 1}$ and $V_{\Delta 2}$, may be the same or different, which provides another degree of freedom to control the outcome of compensation.

It should be understood that for PVT bits employing, for example, thermometer coding, for mismatch corners, the PVT bits can be configured such that a variation between pull-up and pull-down bits is at most one least significant bit (LSB). A similar configuration of the PVT bits can be devised for other PVT bit coding methodologies (e.g., binary-coded PVT bits), as will become apparent to those skilled in the art given the teachings herein.

Figure 4:
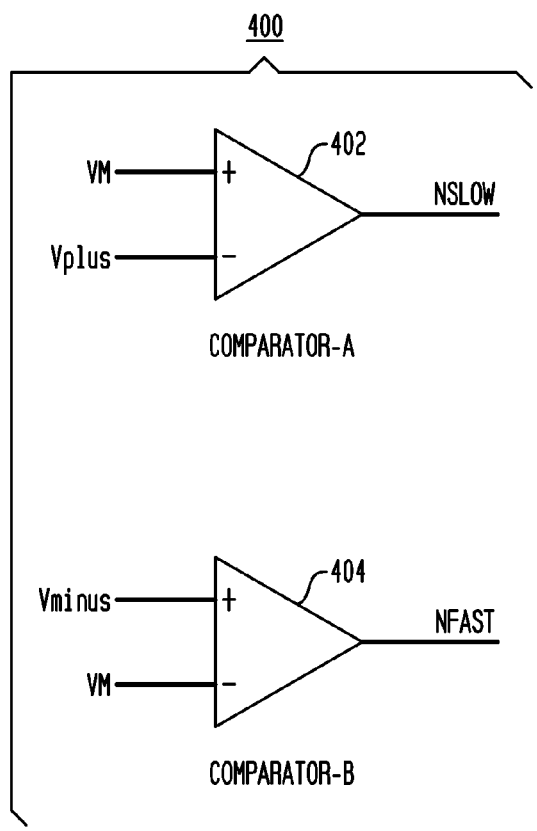
FIG. 4 is a schematic diagram depicting at least a portion of an exemplary control circuit operative to generate control signals indicative of a status of one or more NMOS device characteristics over variations in PVT, according to an embodiment of the invention.

FIG. 4 is a schematic diagram depicting at least a portion of an exemplary control signal generator circuit 400 operative to generate output control signals indicative of a status of one or more NMOS device characteristics over variations in PVT, according to an embodiment of the invention. Circuit 400 comprises a first comparator (comparator-A) 402 and a second comparator (comparator-B) 404. Comparator 402 is operative to compare a prescribed upper threshold voltage, $V_{plus}$, with a reference voltage VM, which may be generated by a PVT monitoring circuit (e.g., PVT monitoring circuit 300 shown in FIG. 3), indicative of one or more characteristics of PMOS and/or NMOS transistor devices over a range of PVT conditions to which a buffer circuit may be subjected. Comparator 402 generates a control signal, NSLOW, which is a logic high level only when voltage VM is higher than threshold voltage $V_{plus}$. Under this condition, pull-down impedance will be higher than pull-up impedance. Similarly, comparator 404 is operative to compare a prescribed lower threshold voltage, $V_{minus}$, with the reference voltage VM, and to generate a control signal, NFAST, which is a logic high level only when voltage VM is lower than threshold voltage $V_{minus}$. Under this condition, pull-down impedance will be lower than pull-up impedance. When control signals NSLOW and NFAST are at a logic low level (e.g., zero volts), pull-up and pull-down impedances are substantially equal (i.e., impedance balanced or matched). In this illustrative embodiment, both outputs from comparators 402 and 404, NSLOW and NFAST, respectively, cannot be high simultaneously.

It is to be appreciated that, conversely, control signal NSLOW being at a logic high level also indicates that PMOS devices are faster compared to NMOS devices. Similarly, control signal NFAST being at a logic high level also indicates that PMOS devices are slower than NMOS devices. Since, in this embodiment, the pull-up structure is being compensated first and the pull-down structure is compensated based on the status of the monitoring circuit, NFAST and NSLOW signal names have been arbitrarily adopted. The invention, however, is not limited to this or any particular naming convention. For example, according to other embodiments, an alternative naming convention may be adopted in which PSLOW and PFAST are utilized as signal names for the control signals when the pull-up structure is compensated based on the pull-down structure being compensated first.

Based at least in part on a state of the control signals NSLOW and/or NFAST, PVT bits for compensating the pull-down devices can be generated, such as, for example, by decrementing the pull-up bits by one when NFAST is high, or by incrementing the pull-up bits by one when NSLOW is high. When both control signals NSLOW and NFAST are low, pull-down PVT bits are made equal to pull-up PVT bits. This shifting of PVT bits can be achieved using a control circuit, as will be described in further detail in conjunction with FIG. 5.

Figure 5:
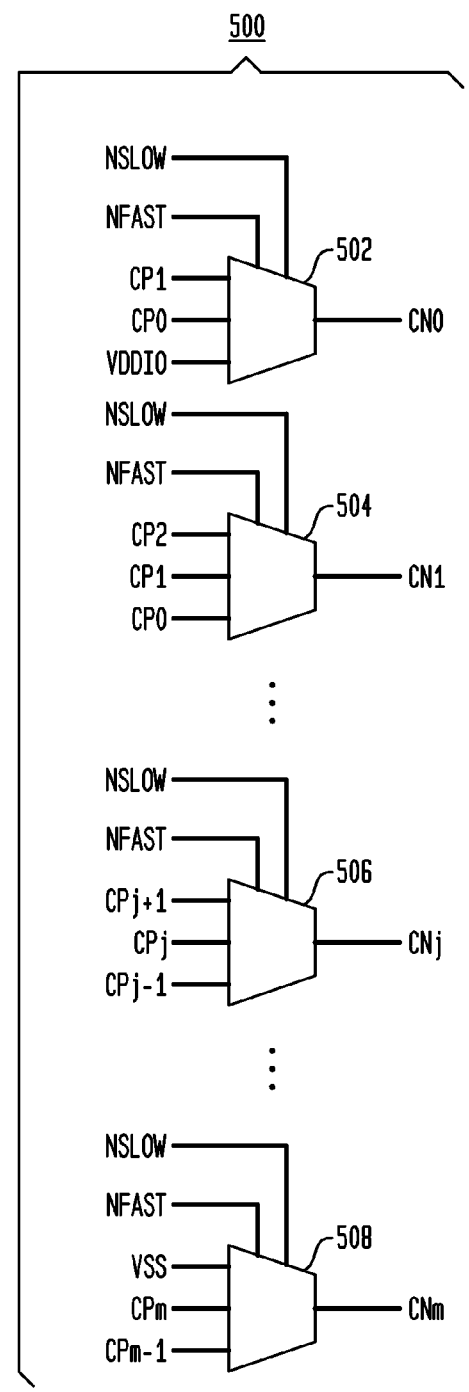
FIG. 5 is a schematic diagram depicting at least a portion of an exemplary PVT bit generator circuit operative to generate pull-down PVT bits based at least in part on pull-up device compensation, according to an embodiment of the invention.

FIG. 5 is a schematic diagram depicting at least a portion of an exemplary PVT bit generator circuit 500 operative to generate pull-down PVT bits based at least in part on pull-up device compensation, according to an embodiment of the invention. PVT bit generator circuit 500 is operative to generate a set of m+1 digital output signals, CN[m:0] for compensating one or more NMOS devices in an output stage of a buffer circuit to be compensated, where m is an integer. Circuit 500 comprises m+1 multiplexers, 502, 504, 506 and 508. In this exemplary embodiment, each multiplexer includes three inputs adapted to receive respective input signals, $CP_{j+1}$, $CP_j$, and $CP_{j-1}$, and two control inputs adapted to receive respective control signals, NFAST and NSLOW. Each multiplexer is operative to generate, at an output thereof, an output signal indicative of a selected one of its input signals as a function of a logical state of the respective control signals NFAST and NSLOW supplied thereto. Preferably, each of multiplexers 502, 504, 506 and 508 comprises a latch or alternative circuitry operative to at least temporarily store a logical state of digital output signals CN[m:0].

More particularly, a first multiplexer 502 is adapted to receive input signals CP1, CP0 and VDDIO and to generate an output signal CN0 as a function of control signals NFAST and NSLOW. A second multiplexer 504 is adapted to receive input signals CP2, CP1 and CP0 and to generate an output signal CN1 as a function of control signals NFAST and NSLOW. A jth multiplexer 506 is adapted to receive input signals $CP_{j+1}$, $CP_j$ and $CP_{j-1}$ and to generate an output signal CNj as a function of control signals NFAST and NSLOW, where j is an integer. An mth multiplexer 508 is adapted to receive input signals VSS, $CP_m$ and $CP_{m-1}$ and to generate an output signal $CN_m$ as a function of control signals NFAST and NSLOW, where m is an integer greater than j.

The multiplexers 502, 504, 506 and 508 are preferably configured such that when control signal NSLOW is a logic high level (i.e., NSLOW=1), each pull-down PVT bit $CN_k$ generated by circuit 500 is equal to input signal $CP_{k+1}$, where k is an integer between 0 and m (i.e., k=0 . . . m), thereby effectively shifting the PVT control bits used for NMOS device compensation one bit higher than the PVT control bits used for PMOS device compensation in the buffer circuit (since the NMOS devices are slower than PMOS devices in this scenario). Likewise, when control signal NFAST is a logic high level (i.e., NFAST=1), each pull-down PVT bit $CN_k$ is equal to input signal $CP_{k-1}$, thereby effectively shifting the PVT control bits used for NMOS device compensation one bit lower than the PVT control bits used for PMOS device compensation. Otherwise, $CN_k$ is equal to $CP_k$, thereby setting the PVT control bits used for NMOS device compensation the same as the PVT control bits used for PMOS device compensation. Shifting the PVT control bits can be implemented by alternative techniques (e.g., shift register, counter, etc.), according to other embodiments of the invention, and applies to essentially any type of coding scheme used for the PVT control bits, as will become apparent to those skilled in the art given the teachings herein.

By way of example only and without loss of generality, assuming $CP_k$=0011, when NSLOW=1 (indicating that NMOS devices are slower than PMOS devices), $CN_k$ will be set equal to $CP_{k+1}$=0111 for a thermometer coding scheme, or 0100 for a binary coding scheme. Likewise, when NFAST=1 (indicating that NMOS devices are faster than PMOS devices), assuming $CP_k$=0011, $CN_k$ will be set equal to $CP_{k-1}$=0001 for a thermometer coding scheme, or 0010 for a binary coding scheme. When NSLOW and NFAST are both 0, $CN_k$=$CP_k$=0011.

Figure 6:
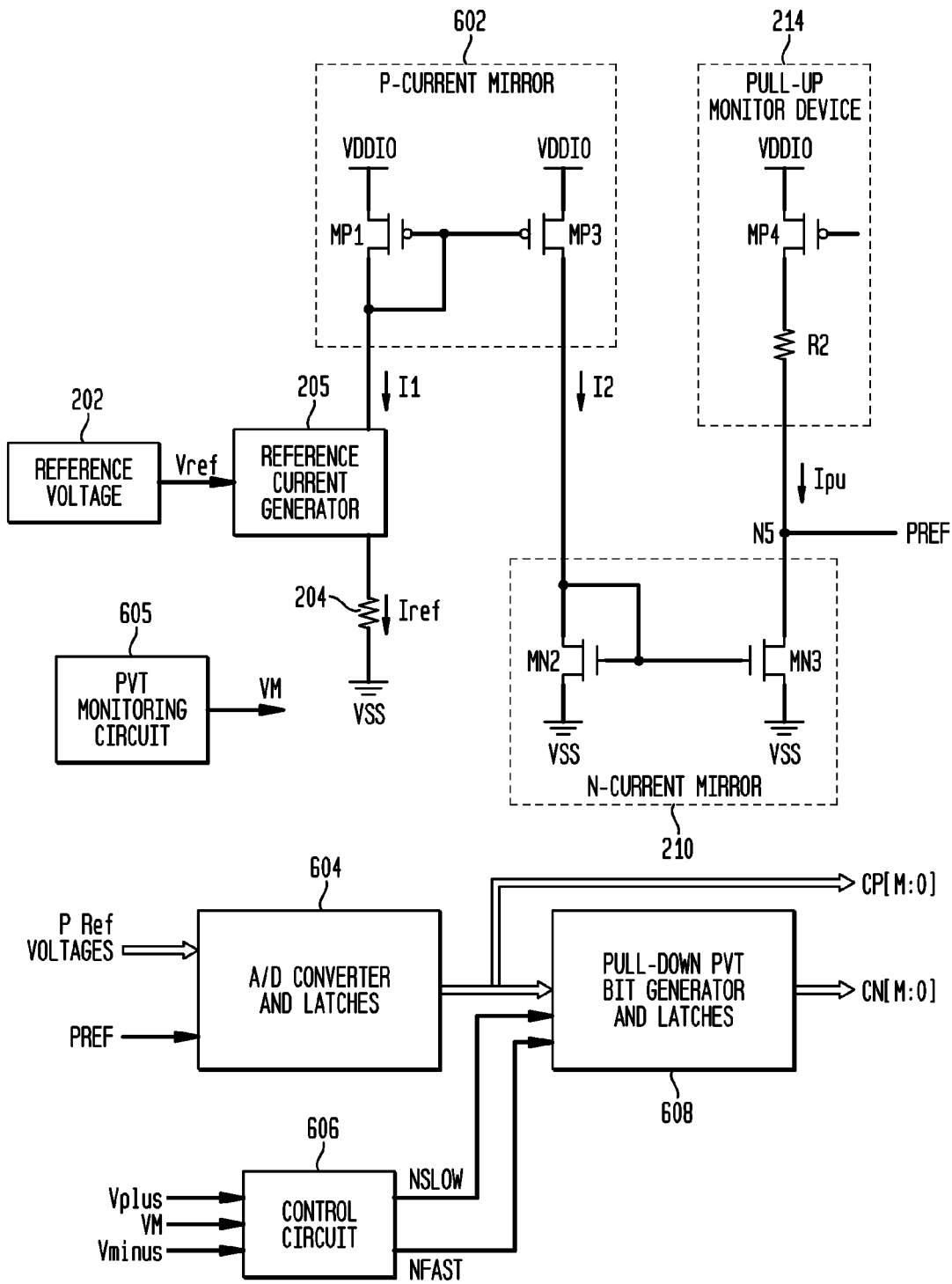
FIG. 6 is a schematic diagram depicting at least a portion of an exemplary PVT compensation circuit which utilizes pull-up impedance compensation and then generates pull-down compensation bits based on the pull-up impedance compensation results, according to an embodiment of the present invention.

FIG. 6 is a schematic diagram depicting at least a portion of an exemplary PVT compensation circuit 600 which utilizes pull-up impedance compensation and then generates pull-down compensation bits based on the pull-up impedance compensation results, according to an embodiment of the invention. PVT compensation circuit 600 may be employed, for example, in a compensated buffer circuit for compensating one of more PMOS and NMOS transistor devices in at least an output stage of the buffer circuit. Like the illustrative PVT compensation circuit 200 shown in FIG. 2, PVT compensation circuit 600 preferably comprises a reference voltage source 202 for generating a reference voltage, Vref. The reference voltage Vref is converted to a reference current, Iref, using a precision resistor 204 coupled with a reference current generator 205, as previously described in conjunction with FIG. 2. Resistor 204 may be included in the PVT compensation circuit 600 or it may be supplied externally.

The reference current Iref is replicated, using a P-current mirror 602 and an N-current mirror 210, to generate a pull-up current, Ipu. Since, in this embodiment, only pull-up compensation is independently performed, the pull-down monitor device 212 and a corresponding leg of the P-current mirror 208 shown in FIG. 2 has been eliminated in PVT compensation circuit 600. A pull-up monitor device 214, which as previously stated is configured to closely track a corresponding pull-up portion of an output stage in a buffer circuit, is connected with N-current mirror 210 at node N5. Pull-up current Ipu flows through the pull-up monitor device 214 to generate an analog reference signal, PREF, at node N5 which reflects a status of the PMOS transistor device(s), assuming an output stage of the type shown in FIG. 1A, or a status of the PMOS transistor device(s) and series resistor(s), assuming an output stage of the type shown in FIG. 1B, over variations in PVT conditions to which the output stage is subjected.

Analog reference signal PREF is supplied to an A/D converter circuit 604 where it is converted to a corresponding digital control signal, CPj, where j is a positive integer. Control signal CPj is a subset (e.g., a pull-up portion) of an overall set of PVT control bits, or simply PVT bits, used to compensate the buffer circuit. Digital control signal CPj is a function of PREF as well as P-reference voltages supplied, for example, by a reference voltage source. More particularly, A/D converter circuit 604 preferably generates m+1 digital PVT control bits (i.e., compensation bits), CP[m:0], where m is a positive integer, as a function of P-reference voltages and reference signal PREF for compensating one or more PMOS devices in an output stage of the buffer circuit to be compensated. It is to be understood that the invention is not limited to any particular number of digital control bits generated by A/D converter circuit 604. The number of bits (m+1) in digital control signal CPj, j=0 . . . m, will depend on the desired granularity (i.e., accuracy) as well as area and operational complexity of compensation. Furthermore, A/D converter circuit 604 may include latch circuitry for at least temporarily storing a logical state of digital control bits CP[m:0].

PVT compensation circuit 600 further includes a PVT monitoring circuit 605. PVT monitoring circuit 605, which may be implemented in a manner consistent with the illustrative PVT monitoring circuit 300 shown in FIG. 3, is preferably designed to closely approximate an output stage of a buffer circuit to be compensated. Ideally, a pull-up structure in monitoring circuit 605 is identical to a corresponding pull-up structure in an output stage of a buffer circuit to be compensated, and a pull-down structure in the monitoring circuit is identical to a corresponding pull-down structure in the output stage of the buffer circuit.

PVT monitoring circuit 605 is operative to generate an analog reference signal, VM, having a value (in this illustrative embodiment, a voltage) that is indicative of at least one operating characteristic (e.g., output impedance) of the pull-up and pull-down structures over PVT variations. Under nominal conditions (e.g., nominal PVT), VM is preferably about half VDDIO (i.e., VDDIO/2). As process characteristics, voltage and/or temperature change, VM will be higher or lower than half VDDIO, as previously stated in conjunction with FIG. 3. For example, if the IC fabrication process is such that NMOS transistors are fast relative to PMOS transistors, then voltage VM will be lower than half VDDIO. Likewise, if the process is such that NMOS transistors are slower relative to PMOS transistors, then voltage VM will be higher than half VDDIO. Under all specified PVT conditions, voltage VM is lower than a first prescribed threshold voltage, $V_{minus}$, when NMOS transistors are fast relative to PMOS transistors in the process, and VM is higher than a second prescribed threshold voltage, $V_{plus}$, when NMOS transistors are slow relative to PMOS transistors in the process. Threshold voltages $V_{minus}$ and $V_{plus}$ may be defined as shown in equations (1) and (2) above.

Reference voltage VM, along with threshold voltages $V_{minus}$ and $V_{plus}$, are fed to a control circuit 606, which may be implemented in a manner consistent with the illustrative control circuit 400 shown in FIG. 4. Control circuit 606 is operative to generate a set of control signals, NSLOW and NFAST. Control signal NSLOW is preferably a logic high level only when voltage VM is higher than threshold voltage $V_{plus}$. Under this condition, pull-down impedance will be higher than pull-up impedance. Similarly, control signal NFAST is preferably a logic high level only when voltage VM is lower than threshold voltage $V_{minus}$. Under this condition, pull-down impedance will be lower than pull-up impedance. When control signals NSLOW and NFAST are at a logic low level (e.g., zero volts), pull-up and pull-down impedances are substantially equal (i.e., impedance balanced or matched). In this illustrative embodiment, both control signals NSLOW and NFAST cannot be high simultaneously. It is to be appreciated that, in accordance with alternative embodiments, other control signal generation techniques may be employed, as will become apparent to those skilled in the art given the teachings herein.

An important aspect of the invention is that, in order to keep a difference between the respective pull-up and pull-down impedances of the output stage within a prescribed limit, pull-down PVT bits are preferably generated based on the independently performed pull-up device compensation, as previously described. In an alternative embodiment, pull-down device compensation may be independently performed first, and then pull-up PVT bits generated based on the pull-down PVT bits, as will become apparent to the skilled artisan given the teachings herein. Accordingly, PVT compensation circuit 600 further includes a pull-down PVT bit generator circuit 608, which may be implemented in a manner consistent with the illustrative PVT bit generator circuit 500 shown in FIG. 5.

PVT bit generator circuit 608 is operative to generate pull-down PVT bits based at least in part on pull-up device compensation, according to an embodiment of the invention. Like PVT bit generator circuit 500 (see FIG. 5), PVT bit generator circuit 608 is operative to generate a set of m+1 digital output signals, CN[m:0] for compensating one or more NMOS devices in the output stage of a buffer circuit to be compensated, where m is an integer. More particularly, PVT bit generator circuit 608 comprises m multiplexers, each multiplexer including three inputs adapted to receive respective input signals, $Cp_{j+1}$, $CP_j$, and $CP_{j-1}$, where j is an integer, j=0 ... m, and two control inputs adapted to receive respective control signals, NFAST and NSLOW. For each pull-up PVT bit CPj, the pull-down PVT bit generator circuit 608 is operative to generate a corresponding pull-down PVT bit CNj which is either shifted one LSB up from CPj (i.e., CNj=$CP_{j+1}$), shifted one LSB down from CPj (i.e., CNj=$CP_{j-1}$), or equal to CPj (i.e., CNj=CPj), depending on a logical state of the respective control signals NFAST and NSLOW. Preferably, pull-down PVT bit generator circuit 608, like A/D converter circuit 604, comprises latches for at least temporarily storing a logical state of digital PVT bits CN[m:0]. Collectively, the A/D converter circuit 604, PVT monitoring circuit 605, control signal generator circuit 606 and pull-down PVT bit generator circuit 608 may be considered a control circuit.

It is to be understood that, according to other embodiments of the invention, pull-down compensation may be performed first, and then pull-up compensation bits may be generated based at least in part on the pull-down compensation results, as well as a control signal indicative of a monitored status of the output stage over variations in PVT conditions to which the output stage may be subjected. In this manner, a difference between respective pull-up and pull-down impedances can be advantageously maintained within a specified limit. Ideally, one could monitor independent variation of pull-up and pull-down compensation and use the compensation type that offers a tighter spread of impedance across the prescribed PVT corners, and then generate the other compensation bits in accordance with methodologies described herein.

Figure 7:
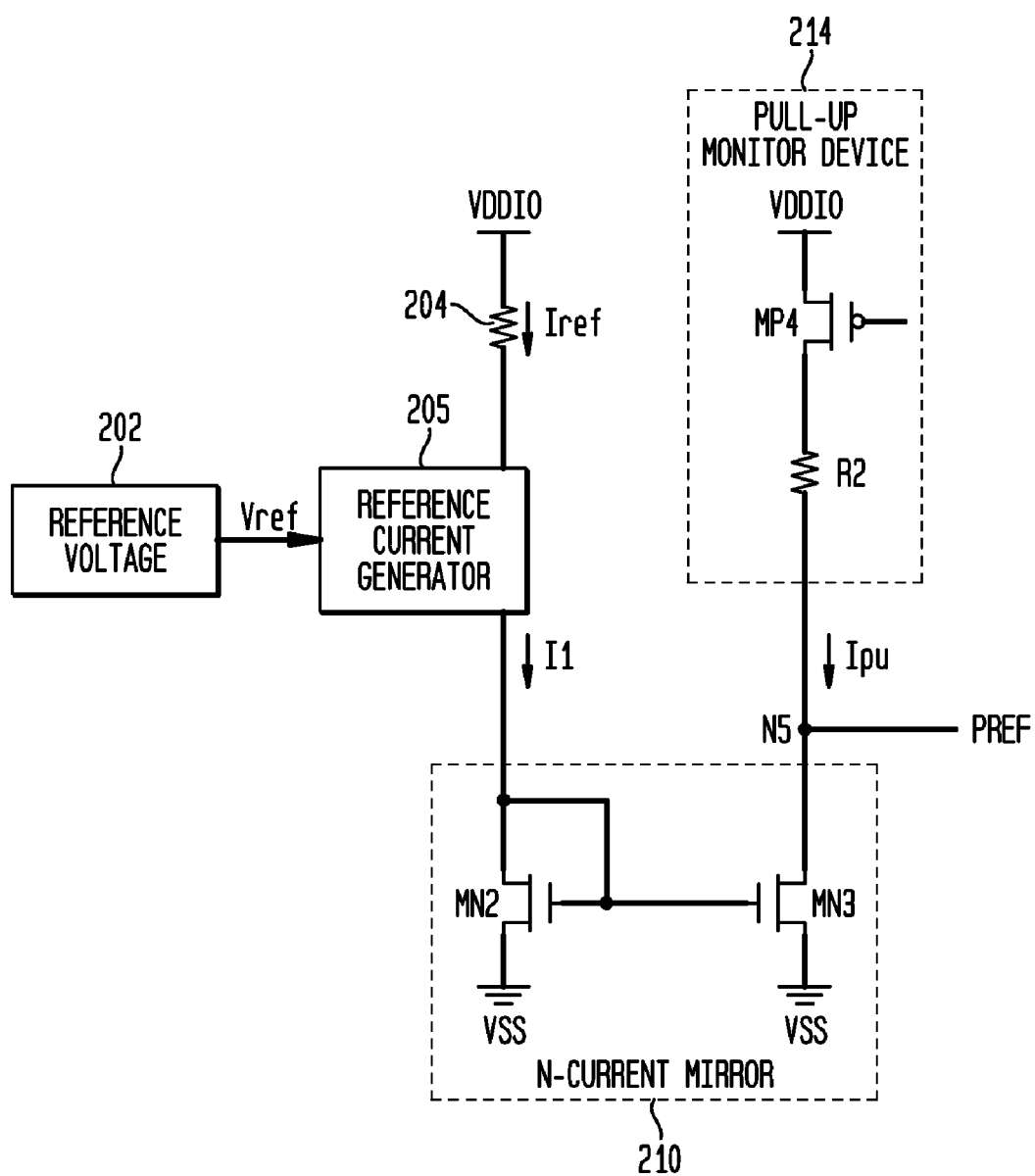
FIG. 7 is a schematic diagram depicting at least a portion of an exemplary alternative circuit for generating an analog reference signal for compensating one or more PMOS devices which may be used in conjunction with the PVT compensation circuit shown in FIG. 6, according to an embodiment of the present invention.

FIG. 7 is a schematic diagram depicting at least a portion of an exemplary alternative circuit 700 for generating an analog reference signal, PREF, for compensating one or more PMOS devices which may be used in conjunction with the PVT compensation circuit 600 shown in FIG. 6, according to an embodiment of the invention. As apparent from FIG. 7, analog reference signal generator circuit 700 beneficially eliminates a P-current mirror (e.g., P-current mirror 602 shown in FIG. 6) by connecting precision resistor 204 with VDDIO, rather than with VSS, and connecting the drain of NMOS transistor MN2 in N-current mirror 210 directly to reference current generator 205. By eliminating the P-current mirror, any error introduced by the P-current mirror in replicating reference current Iref will also be eliminated, thereby improving performance. Furthermore, the size of the PVT compensation circuit in which the analog reference signal generator circuit 700 is used can be reduced, which is desirable.

Figure 8:
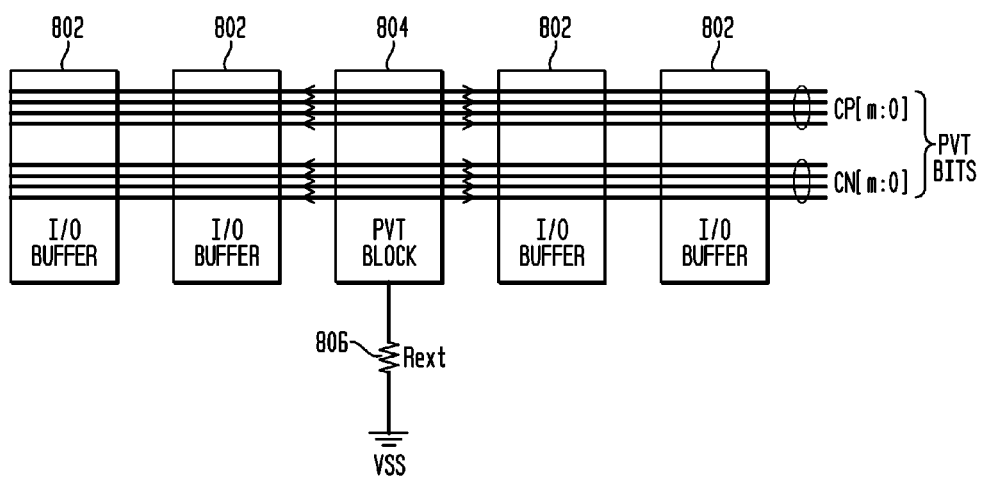
FIG. 8 is a block diagram depicting at least a portion of an exemplary compensated buffer circuit, according to an embodiment of the present invention.

FIG. 8 is a block diagram depicting at least a portion of an exemplary compensated buffer circuit 800, according to an embodiment of the invention. Compensated buffer circuit 800 includes a plurality of I/O buffers 802, each of at least a subset of the I/O buffers including control inputs adapted to receive corresponding digital control bits (PVT bits), namely, pull-up PVT bits CP[m:0] and pull-down PVT bits CN[m:0], for compensating the I/O buffers for variations in PVT conditions to which the I/O buffers may be subjected. The PVT bits CP[m:0] and CN[m:0] are generated by a PVT block 804 operatively coupled with the I/O buffers 802 according to techniques previously described herein. An external precision resistor (Rext) 806 coupled with PVT block 804 is preferably used to control a value of reference current in the PVT block for monitoring an operating status of pull-up and pull-down structures in the I/O buffers 802, as previously described. Although resistor 806 is shown connected with VSS, the invention contemplates that this resistor may be connected with essentially any reference voltage source.

Furthermore, although compensated buffer circuit 800 is shown in this illustrative embodiment as including a single PVT block 804, the invention, according to alternative embodiments thereof, may include more than one PVT block. In this instance, each PVT block would be coupled with a corresponding subset of I/O buffers, with each PVT block independently generating its own set of PVT bits for compensating the respective I/O buffers coupled therewith. PVT block 804 is preferably located in close relative proximity to the corresponding I/O buffers 802 to which it is coupled. This may be beneficial, for example, to improve the accuracy of PVT compensation, particularly when the I/O buffers 802 in the compensated buffer circuit 800 are arranged on a given IC in such a manner that there is a relatively large gradient in PVT conditions among the respective I/O buffers. Thus, no limitation as to the specific number of PVT blocks 804 used in the compensated buffer circuit 800 is intended or should be inferred.

Figure 9A:
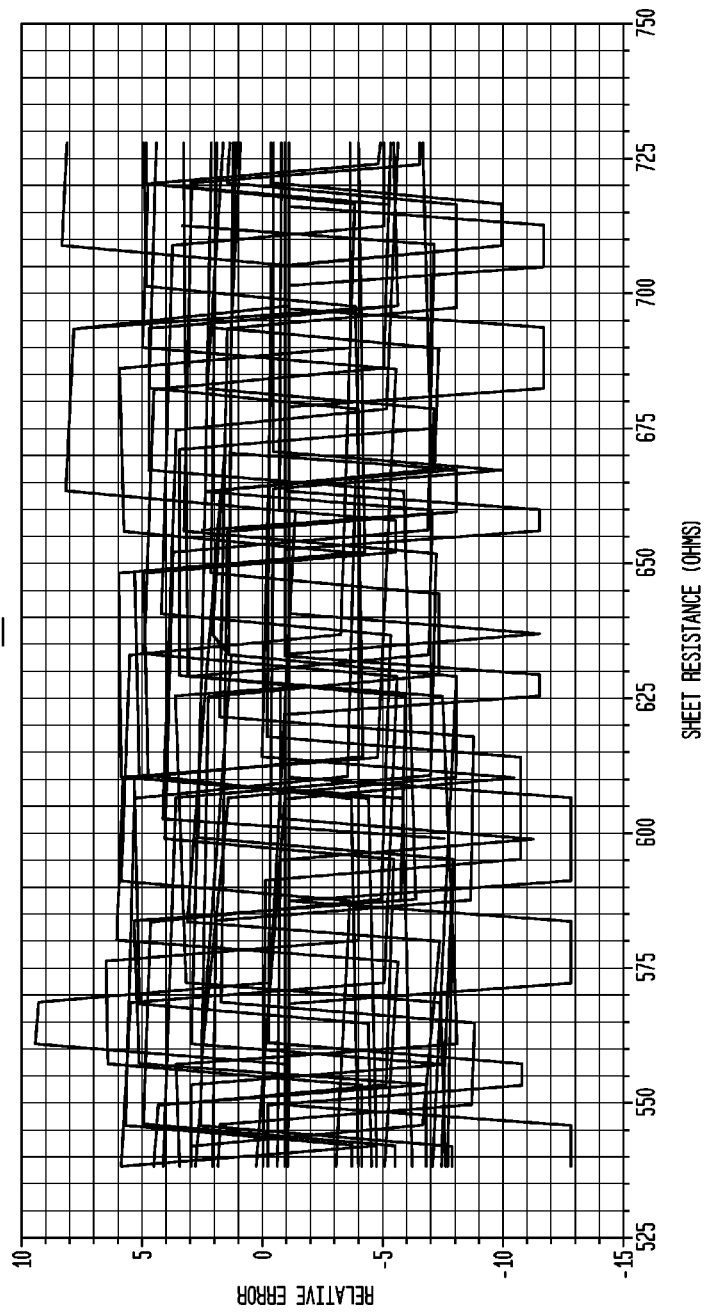
FIG. 9A is a graph including exemplary simulation waveforms illustrating relative error spread between pull-up and pull-down impedances associated with an output stage of a buffer circuit when separate and independent pull-up and pull-down impedance compensation is employed.

FIG. 9A is a graph including exemplary simulation waveforms 900 illustrating relative error spread between pull-up and pull-down impedances associated with an output stage of a buffer circuit when separate and independent pull-up and pull-down impedance compensation is employed. The simulation used to generate waveforms 900 is preferably configured to vary a sheet resistance of the polysilicon resistor(s) (e.g., resistors RP and/or RN in FIG. 3) between prescribed minimum and maximum limits under all specified PVT corners. Since resistor RP (or, similarly, resistor RN) in FIG. 3 comprises a bulk of the output impedance, a direct current (DC) sweep of the sheet resistance under all specified PVT corners displays substantially all possible impedances of the buffer circuit. As the sheet resistance goes up, output impedance would go up and at some point the PVT compensation circuit (e.g., exemplary portions of which are illustrated in FIGS. 2 through 6) would generate one extra bit in an attempt to reduce the output impedance in the buffer circuit. Since the respective bits corresponding to the two compensation types (e.g., pull-up and pull-down) may not be set for the same values of sheet resistance, it is likely that there will be occasions when pull-up and pull-down bits will differ. As apparent from FIG. 9A, relative impedance $R_{rel}$ exhibits variations over specified PVT conditions that are beyond a typical design specification of about ±10% (e.g., about +9.5 to about −13.0).

Figure 9B:
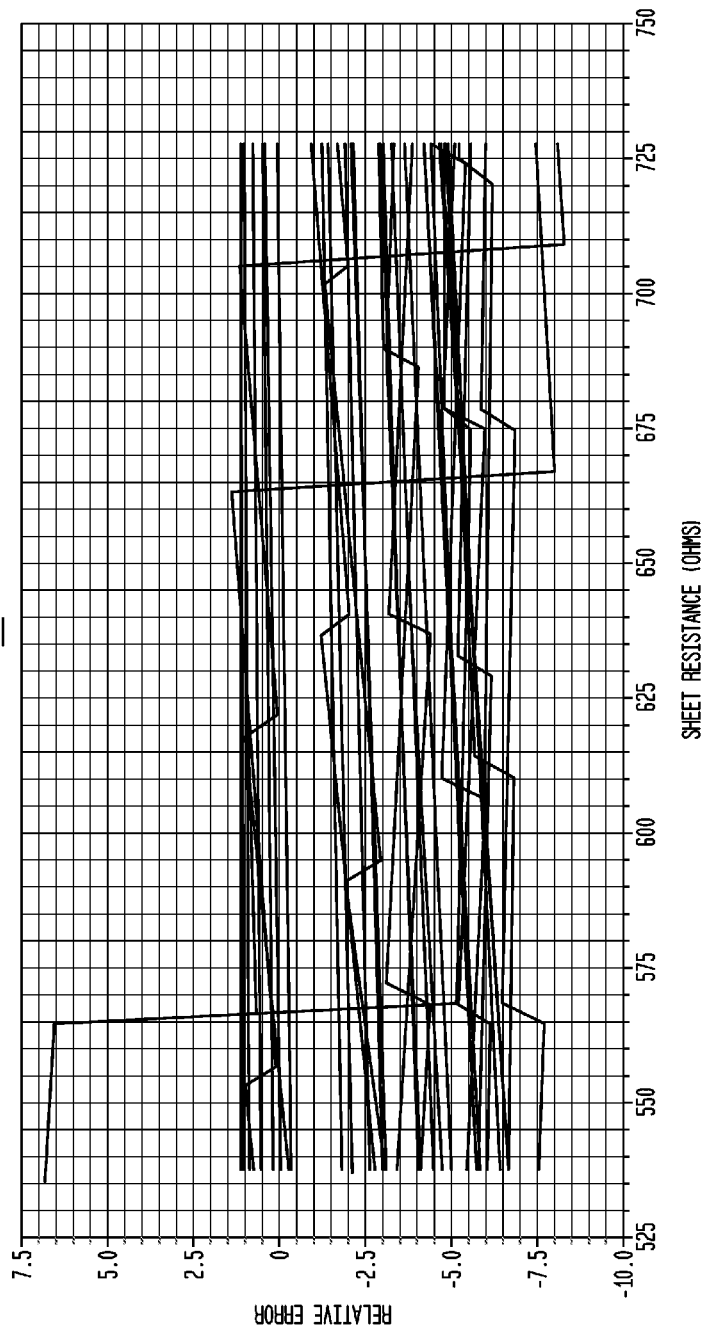
FIG. 9B is a graph including exemplary simulation waveforms illustrating relative error spread between pull-up and pull-down impedances associated with an output stage of a buffer circuit when using a single compensation methodology, according to an embodiment of the present invention.

FIG. 9B is a graph including exemplary simulation waveforms 950 illustrating relative error spread between pull-up and pull-down impedances associated with an output stage of a buffer circuit when using a single compensation methodology, according to an embodiment of the present invention. The simulation used to generate waveforms 950 is preferably configured in a manner consistent with that described above in conjunction with FIG. 9A. As apparent from FIG. 9B, the relative impedance $R_{rel}$ using techniques of the invention exhibits variations over specified PVT conditions that are well within the typical design specification of about ±10% (e.g., about +6.8 to about −8.3).

In a PVT simulation of a buffer circuit employing the inventive compensation methodology, a model preferably selects the slowest, nominal or the fastest values of the transistor devices. In practice, sheet resistance can reside anywhere within a minimum and maximum range for a given IC process. In this implementation, since polysilicon resistors contribute to a bulk of the impedance, the sheet resistance of the polysilicon resistors is varied between the minimum and maximum values and simulations are run for all process corners, voltages and temperatures. The horizontal axis (i.e., x-axis) in FIGS. 9A and 9B represents the sheet resistance of the polysilicon resistors in ohms; the vertical axis (i.e., y-axis) represents the relative error defined earlier. Each individual waveform represents one PVT corner, although it is the spread in relative error across the prescribed PVT corners as presented in FIGS. 9A and 9B that is of greater significance for comparison.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in FIGS. 1A through 8, or portions thereof, may be part of an integrated circuit. Integrated circuits so manufactured are considered part of this invention.

An integrated circuit in accordance with the present invention can be employed in essentially any application and/or electronic system in which a buffer circuit is utilized. Suitable systems for implementing techniques of the invention may include, but are not limited to, personal computers, communication networks, electronic instruments (e.g., automated test equipment (ATE)), interface networks, high-speed memory interfaces (e.g., DDR3, DDR4), etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A compensation circuit for controlling a variation in output impedance of at least one buffer circuit, the compensation circuit comprising:
    a monitor circuit including a pull-up portion comprising at least one PMOS transistor and a pull-down portion comprising at least one NMOS transistor, the monitor circuit being configured to track an operation of an output stage of the buffer circuit and being operative to generate at least a first control signal indicative of a status of at least one characteristic of corresponding pull-up and pull-down portions in the output stage of the buffer circuit over variations in at least one of process, voltage and temperature (PVT) conditions to which the buffer circuit may be subjected; and
    a control circuit generating a first set of digital control bits and a second set of digital control bits for compensating the pull-up and pull-down portions in the output stage of the buffer circuit over prescribed variations in PVT conditions, the second set of digital control bits being generated based at least on the first set of digital control bits and the first control signal.

2. The compensation circuit of claim 1, further comprising:
    a reference circuit operative to generate at least one of a reference voltage and a reference current; and
    a monitor device adapted to receive the at least one of the reference voltage and the reference current and operative to generate an analog reference signal indicative of a status of a corresponding one of the pull-up portion and the pull-down portion in the output stage of the buffer circuit over prescribed variations in PVT conditions;
    wherein the first set of digital control bits is generated as a function of the analog reference signal.

3. The compensation circuit of claim 2, wherein the control circuit comprises an analog-to-digital converter circuit coupled with the monitor device and operative to receive the analog reference signal and at least one reference threshold voltage and to generate the first set of digital control signals as a function of the analog reference signal and the at least one reference threshold voltage.

4. The compensation circuit of claim 2, wherein the pull-up portion in the monitor circuit comprises the at least one PMOS transistor and at least a first resistor connected in series with the at least one PMOS transistor, the pull-down portion in the monitor circuit comprises the at least one NMOS transistor and at least a second resistor connected in series with the at least one NMOS transistor, and the analog reference signal generated by the monitor device is indicative of a status of a corresponding one of the pull-up portion and the pull-down portion in the output stage of the buffer circuit over prescribed variations in PVT conditions.

5. The compensation circuit of claim 2, wherein the pull-up portion in the monitor circuit comprises a plurality of PMOS transistors, the pull-down portion in the monitor circuit comprises a plurality of NMOS transistors, and the analog reference signal generated by the monitor device is indicative of a status of a corresponding one of the pull-up portion and the pull-down portion in the output stage of the buffer circuit over prescribed variations in PVT conditions.

6. The compensation circuit of claim 2, wherein the pull-up portion in the monitor circuit comprises a plurality of PMOS transistors and at least a first resistor connected in series with the PMOS transistors, the pull-down portion in the monitor circuit comprises a plurality of NMOS transistors and at least a second resistor connected in series with the NMOS transistors, and the analog reference signal generated by the monitor device is indicative of a status of a corresponding one of the pull-up portion and the pull-down portion in the output stage of the buffer circuit over prescribed variations in PVT conditions.

7. The compensation circuit of claim 1, further comprising:
a reference current generator operative to generate a substantially constant reference current; and
a pull-up monitor device comprising at least one PMOS transistor that is substantially matched to a corresponding PMOS transistor in the output stage of the buffer circuit, the pull-up monitor device being operative to receive the reference current and to generate an analog reference signal indicative of a status of the corresponding PMOS transistor in the output stage over prescribed variations in PVT conditions;
wherein the first set of digital control bits is generated as a function of the analog reference signal.

8. The compensation circuit of claim 1, further comprising:
a reference current generator operative to generate a substantially constant reference current; and
a pull-down monitor device comprising at least one NMOS transistor that is substantially matched to a corresponding NMOS transistor in the output stage of the buffer circuit, the pull-down monitor device being operative to receive the reference current and to generate an analog reference signal indicative of a status of the corresponding NMOS transistor in the output stage over prescribed variations in PVT conditions;
wherein the first set of digital control bits is generated as a function of the analog reference signal.

9. The compensation circuit of claim 1, wherein the control circuit comprises a plurality of multiplexers, each of at least a subset of the multiplexers including at least first, second and third inputs for receiving a logical value of a given bit position in the first set of the digital control bits, a logical value of an adjacent bit position below the given bit position and a logical value of an adjacent bit position above the given bit position in the first set of the digital control bits, respectively, and being adapted to receive the first control signal, the multiplexer selecting, as an output of the control circuit for a corresponding bit position in the second set of digital control bits, one of the first, second and third inputs as a function of the first control signal.

10. The compensation circuit of claim 1, wherein the control circuit comprises a control signal generator including first and second comparators, the first comparator being operative to compare a first threshold voltage with the first control signal and to generate a second control signal indicative of a pull-down impedance of the output stage being greater than a pull-up impedance of the output stage, the second comparator being operative to compare a second threshold voltage with the first control signal and to generate a third control signal which is indicative of a pull-down impedance of the output stage being less than a pull-up impedance of the output stage, the second set of digital control bits being assigned based on the first set of digital control bits as a function of the second and third control signals.

11. The compensation circuit of claim 1, wherein the monitor circuit comprises:
first and second resistors;
a PMOS transistor including a first source/drain adapted for connection with a first voltage supply of the compensation circuit, a gate adapted for receiving a second control signal, and a second source/drain connected with a first terminal of the first resistor, a second terminal of the first resistor being connected with an output of the monitor circuit; and
an NMOS transistor including a first source/drain adapted for connection with a second voltage supply of the compensation circuit, a gate adapted for receiving a third control signal, and a second source/drain connected with a first terminal of the second resistor, a second terminal of the second resistor being connected with the output of the monitor circuit.

12. The compensation circuit of claim 11, wherein the second control signal is the second voltage supply and the third control signal is the first voltage supply.

13. The compensation circuit of claim 11, wherein the second control signal is operative such that the PMOS transistor is turned on during a normal mode of operation of the compensation circuit and the PMOS transistor is turned off during a power down mode of operation of the compensation circuit, and wherein the third control signal is operative such that the NMOS transistor is turned on during the normal mode of operation and the NMOS transistor is turned off during the power down mode of operation.

14. The compensation circuit of claim 1, wherein the control circuit is operative: (i) to set the second set of digital control bits to a value which is one least significant bit greater than a value of the first set of digital control bits when the at least first control signal is at a value indicative of NMOS transistors in the buffer circuit being slower than PMOS transistors; (ii) to set the second set of digital control bits to a value which is one least significant bit less than a value of the first set of digital control bits when the at least first control signal is at a value indicative of NMOS transistors in the buffer circuit being faster than PMOS transistors; and (iii) to set the second set of digital control bits to a value which is equal to a value of the first set of digital control bits when the at least first control signal is at a value indicative of NMOS and PMOS transistors in the buffer circuit being substantially the same speed.

15. The compensation circuit of claim 1, wherein the first and second sets of digital control bits are coded using one of a thermometer coding and a binary coding.

16. The compensation circuit of claim 1, wherein at least a portion of the compensation circuit is formed in at least one integrated circuit.

17. A compensated buffer circuit, comprising:
at least one buffer including an output stage operative to receive an input signal and to generate an output signal at an output of the buffer circuit, the output stage including a pull-up portion comprising at least one PMOS transistor and a pull-down portion comprising at least one NMOS transistor; and
at least one compensation circuit coupled with the at least one buffer for controlling a variation in output impedance of the at least one buffer, the compensation circuit comprising:
a monitor circuit including a pull-up portion comprising at least one PMOS transistor and a pull-down portion comprising at least one NMOS transistor, the monitor circuit being configured to track an operation of the output stage in the at least one buffer and being operative to generate at least a first control signal indicative of a status of at least one characteristic of the pull-up portion in the output stage and the pull-down portion in the output stage over variations in at least one of process, voltage and temperature (PVT) conditions to which the at least one buffer may be subjected; and
a control circuit generating a first set of digital control bits and a second set of digital control bits for compensating the pull-up and pull-down portions in the output stage of the at least one buffer over prescribed variations in PVT conditions, the second set of digital control bits being generated based at least on the first set of digital control bits and the first control signal.

18. The buffer circuit of claim 17, wherein the at least one compensation circuit further comprises:
a reference circuit operative to generate at least one of a reference voltage and a reference current; and
a monitor device adapted to receive the at least one of the reference voltage and the reference current and operative to generate an analog reference signal indicative of a status of a corresponding one of the at least one PMOS transistor and the at least one NMOS transistor in the output stage of the at least one buffer over prescribed variations in PVT conditions;
wherein the first set of digital control bits is generated as a function of the analog reference signal.

19. The buffer circuit of claim 18, wherein the control circuit comprises an analog-to-digital converter circuit coupled with the monitor device and operative to receive the analog reference signal and at least one reference threshold voltage and to generate the first set of digital control signals as a function of the analog reference signal and the at least one reference threshold voltage.

20. The buffer circuit of claim 17, wherein the control circuit in the at least one compensation circuit comprises a plurality of multiplexers, each of at least a subset of the multiplexers including at least first, second and third inputs for receiving a logical value of a given bit position in the first set of the digital control bits, a logical value of an adjacent bit position below the given bit position and a logical value of an adjacent bit position above the given bit position in the first set of the digital control bits, respectively, and being adapted to receive the first control signal, the multiplexer selecting, as an output of the control circuit for a corresponding bit position in the second set of digital control bits, one of the first, second and third inputs as a function of the first control signal.

21. The buffer circuit of claim 17, wherein the control circuit in the at least one compensation circuit comprises a control signal generator including first and second comparators, the first comparator being operative to compare a first threshold voltage with the first control signal and to generate a second control signal indicative of a pull-down impedance of the output stage in the at least one buffer being greater than a pull-up impedance of the output stage, the second comparator being operative to compare a second threshold voltage with the first control signal and to generate a third control signal which is indicative of a pull-down impedance of the output stage in the at least one buffer being less than a pull-up impedance of the output stage, the second set of digital control bits being assigned based on the first set of digital control bits as a function of the second and third control signals.

22. The buffer circuit of claim 17, wherein the control circuit in the at least one compensation circuit is operative: (i) to set the second set of digital control bits to a value which is one least significant bit greater than a value of the first set of digital control bits when the first control signal is at a value indicative of NMOS transistors in the at least one buffer being slower than PMOS transistors in the at least one buffer; (ii) to set the second set of digital control bits to a value which is one least significant bit less than a value of the first set of digital control bits when the first control signal is at a value indicative of NMOS transistors in the at least one buffer being faster than PMOS transistors in the at least one buffer; and (iii) to set the second set of digital control bits to a value which is equal to a value of the first set of digital control bits when the first control signal is at a value indicative of NMOS and PMOS transistors in the at least one buffer being substantially the same speed.

23. The buffer circuit of claim 17, wherein the at least one buffer comprises a plurality of buffers and the at least one compensation circuit comprises a plurality of compensation circuits, a first one of the compensation circuits being coupled with a first subset of the buffers for controlling a variation in output impedance of the first subset of buffers, and at least a second one of the compensation circuits being coupled with a second subset of the buffers for controlling a variation in output impedance of the second subset of buffers.

24. The buffer circuit of claim 17, wherein at least a portion of the buffer circuit is formed in at least one integrated circuit.

25. An electronic system, comprising:
at least one integrated circuit, the at least one integrated circuit including at least one compensation circuit for controlling a variation in output impedance of at least one buffer circuit with which the compensation circuit is operatively coupled, the at least one compensation circuit comprising:
a monitor circuit including a pull-up portion comprising at least one PMOS transistor device and a pull-down portion comprising at least one NMOS transistor device, the monitor circuit being configured to track an operation of an output stage of the buffer circuit and being operative to generate at least a first control signal indicative of a status of at least one characteristic of a corresponding pull-up portion in the output stage of the buffer circuit and a corresponding pull-down portion in the output stage over variations in at least one of process, voltage and temperature (PVT) conditions to which the buffer circuit may be subjected; and
a control circuit generating a first set of digital control bits and a second set of digital control bits for compensating the pull-up and pull-down portions in the output stage of the buffer circuit over prescribed variations in PVT conditions, the second set of digital control bits being generated based at least on the first set of digital control bits and the first control signal.

* * * * *